(12) United States Patent
Owaki

(10) Patent No.: US 8,386,064 B2
(45) Date of Patent: Feb. 26, 2013

(54) CONTROL DEVICE AND CONTROL METHOD

(75) Inventor: Ryosuke Owaki, Hokkaido (JP)

(73) Assignee: Tokyo Electron Limited, Tokyo (JP)

( * ) Notice: Subject to any disclaimer, the term of this patent is extended or adjusted under 35 U.S.C. 154(b) by 320 days.

(21) Appl. No.: 12/933,011

(22) PCT Filed: Mar. 2, 2009

(86) PCT No.: PCT/JP2009/053853
§ 371 (c)(1),
(2), (4) Date: Sep. 16, 2010

(87) PCT Pub. No.: WO2009/116383
PCT Pub. Date: Sep. 24, 2009

(65) Prior Publication Data
US 2011/0015774 A1 Jan. 20, 2011

(30) Foreign Application Priority Data
Mar. 17, 2008 (JP) ................................ 2008-067486

(51) Int. Cl.
*G06F 19/00* (2011.01)
(52) U.S. Cl. ........................................ 700/114; 700/121
(58) Field of Classification Search .................. 700/114, 700/121
See application file for complete search history.

(56) References Cited

U.S. PATENT DOCUMENTS

| 6,244,121 | B1 | 6/2001 | Hunter |
| 6,553,277 | B1 | 4/2003 | Yagisawa et al. |
| 6,879,868 | B2 * | 4/2005 | Mos et al. ..................... 700/114 |
| 7,332,732 | B2 * | 2/2008 | Van Bilsen et al. ........... 250/548 |
| 8,112,171 | B2 * | 2/2012 | Krupyshev ..................... 700/114 |
| 8,135,485 | B2 * | 3/2012 | Chen et al. ..................... 700/114 |
| 8,185,242 | B2 * | 5/2012 | Wong et al. ................... 700/254 |
| 2005/0016818 | A1 * | 1/2005 | Ito et al. ....................... 198/345.1 |

FOREIGN PATENT DOCUMENTS

| JP | 2001-117064 | * | 4/2001 |
| JP | 2002-313872 | | 10/2002 |
| JP | 2005-019963 | | 1/2005 |
| JP | 2006-123157 | | 5/2006 |
| KR | 10-2004-0104421 | | 12/2004 |

OTHER PUBLICATIONS

International Search Report for PCT/JP2009/053853 mailed on Mar. 24, 2009.

* cited by examiner

*Primary Examiner* — Mohammad Ali
*Assistant Examiner* — Sivalingam Sivanesan
(74) *Attorney, Agent, or Firm* — Turocy & Watson, LLP

(57) ABSTRACT

A control device includes a storage unit that stores therein first position information indicating relative positions between one reference processing unit selected from a plurality of processing units and the other non-reference processing units; a first calculation unit that drives the transfer device while a jig formed in the shape of a substrate is held on the transfer device, and calculates a first compensation value for compensating a position deviation between a transfer position of the jig on the transfer device with respect to the reference processing unit and a first transfer target position; and a second calculation unit that calculates a second compensation value for compensating a position deviation between a transfer position of the jig on the transfer device with respect to the non-reference processing unit and a second transfer target position based on the first compensation value and the first position information.

7 Claims, 10 Drawing Sheets

CONTROL DEVICE AND CONTROL METHOD

TECHNICAL FIELD

The present invention relates to a control device and a control method for controlling adjustment of a transfer position of a substrate transfer device that transfers a substrate such as a semiconductor wafer onto a mounting table in a processing unit.

BACKGROUND ART

In a manufacturing process of a semiconductor wafer or the like, a photolithography process is typically performed by a coating and developing apparatus. The coating and developing apparatus includes, for example, a loading/unloading section that loads and unloads the substrate into/from the apparatus; a processing section that accommodates a plurality of processing units for performing various processes such as a resist coating process, a developing process and a heat treatment; and an interface section that transfers the substrate between the processing section and an external exposure apparatus. Further, the coating and developing apparatus has a multiple number of substrate transfer devices that transfer the substrate between the respective sections or between the processing units.

Each substrate transfer device has an arm that holds the substrate. In the substrate transfer device, position adjustment of the arm is important to prevent a position deviation of the semiconductor wafer when the substrate is transferred into the processing unit. Conventionally, prior to transferring the semiconductor wafer, a deviation amount from a wafer transfer target position is calculated, and the substrate transfer position of the substrate transfer device is then adjusted based on the calculation result. The transfer position of the wafer is adjusted while actually driving the substrate transfer device for each processing unit (see, for example, Patent Document 1 and Patent Document 2).

Patent Document 1: Japanese Patent Laid-open Publication No. 2002-313872 (paragraph [0050])
Patent Document 2: Japanese Patent Laid-open Publication No. 2005-19963 (paragraphs [0035] to [0052])

DISCLOSURE OF THE INVENTION

Problems to be Solved by the Invention

In a processing apparatus such as the coating and developing apparatus having the plurality of processing units, however, it takes a long time to carry out position adjustment for the respective processing units while actually driving the substrate transfer devices in sequence, thus exhibiting poor efficiency. Furthermore, in case that the substrate transfer device has a plurality of arms, it takes a longer time because position adjustment needs to be performed for each of the arms.

In view of the foregoing, the present invention provides a control device and a control method capable of improving processing efficiency by sharply reducing time required for position adjustment.

Means for Solving the Problems

In order to solve the above-mentioned problem, in accordance with one aspect of the present invention, there is provided a control device of a substrate processing apparatus having a plurality of processing units for performing a process on a substrate and a transfer device for holding the substrate thereon and transferring the substrate into each processing unit. The control device controls adjustment of a transfer position of the transfer device. The control device includes: a storage unit that stores therein first position information indicating relative positions between one reference processing unit selected from the plurality of processing units and the rest non-reference processing units; a first calculation unit that drives the transfer device while a jig formed in the shape of the substrate is held on the transfer device, and calculates a first compensation value for compensating a position deviation between a transfer position of the jig on the transfer device with respect to the reference processing unit and a first transfer target position; and a second calculation unit that calculates a second compensation value for compensating a position deviation between a transfer position of the jig on the transfer device with respect to the non-reference processing unit and a second transfer target position based on the first compensation value and the first position information.

Here, the substrate processing apparatus may be, for example, a coating and a developing apparatus, a film forming apparatus, an etching apparatus, a cleaning apparatus, or the like. Further, the transfer device may be, e.g., a transfer arm and a driving mechanism therefor. With this configuration, the position deviation for the reference unit can be compensated by calculating the first compensation value. Further, by calculating the second compensation value based on the first compensation value and the first position information indicating the relative position between the reference processing unit and the non-reference processing units, the position deviation for the non-reference processing unit can be compensated without driving the transfer device. Accordingly, the time required for position adjustment can be sharply reduced as compared with the case where the position deviation is compensated while actually driving the transfer device of each processing unit in sequence. Therefore, processing efficiency of the substrate processing apparatus can be improved.

The transfer device may has a plurality of arms for holding the substrate thereon, the storage unit may store therein second position information indicating relative positions between the respective arms, the first calculation unit may calculate the first compensation value for each arm, and the second calculation unit may calculate the second compensation value for each arm of the transfer device with respect to the non-reference processing unit based on the first compensation value of each arm, the first position information and the second position information.

With this configuration, even if the transfer device has the plurality of arms, by using the first compensation value for each arm and the second position information indicating relative positions between the respective arms, the second compensation value can be calculated without driving each arm with respect to the non-reference processing units. Therefore, the time required for position adjustment can be sharply reduced.

Further, The control device may further has an input unit by which a first user input for selecting the reference processing unit from the plurality of processing units and a second user input for changing the selected reference processing unit are inputted.

With this configuration, even in case that there is a problem in the selected reference processing unit, the reference processing unit can be changed, and, thus, the position deviation compensating process can be carried out successfully.

Further, the transfer device may has a plurality of arms for holding the substrate thereon, the storage unit may store therein second position information indicating relative positions between the respective arms, the first calculation unit may calculate the first compensation value for one arm selected from the plurality of arms and the first compensation value for another arm based on the first compensation value of the selected one arm and the second position information, and the second calculation unit may calculate the second compensation value for each arm of the transfer device with respect to the non-reference processing unit based on the first compensation value of the selected one arm, the first position information and the second position information.

With this configuration, even if the transfer device has the plurality of arms, by using the first compensation value of the selected one arm with respect to the reference processing unit and the second position information indicating relative positions between the respective arms, the first compensation value for another arm can be calculated. Therefore, there is no need to calculate the compensation value for each arm. Further, by using the first compensation value of one arm, the second position information and the first position information indicating relative positions between the reference processing unit and the non-reference processing unit, the second compensation value for each arm can be calculated without driving each arm with respect to the non-reference processing units. Accordingly, the time required for position adjustment can be sharply reduced.

In accordance with another aspect of the present invention, there is provided a control method of a substrate processing apparatus having a plurality of processing units for performing a process on a substrate and a transfer device for holding the substrate thereon and transferring the substrate into each processing unit. The control method controls adjustment of a transfer position of the transfer device. The control method includes: storing first position information indicating relative positions between one reference processing unit selected from the plurality of processing units and the rest non-reference processing units; driving the transfer device while a jig formed in the shape of the substrate is held on the transfer device, and calculating a first compensation value for compensating a position deviation between a transfer position of the jig on the transfer device with respect to the reference processing unit and a first transfer target position; and calculating a second compensation value for compensating a position deviation between a transfer position of the jig on the transfer device with respect to the non-reference processing unit and a second transfer target position based on the first compensation value and the first position information.

Effect of the Invention

In accordance with the present invention, it is possible to provide a control device and a control method capable of improving processing efficiency by greatly reducing time required for position alignment.

EXPLANATION OF CODES

Figure 1:
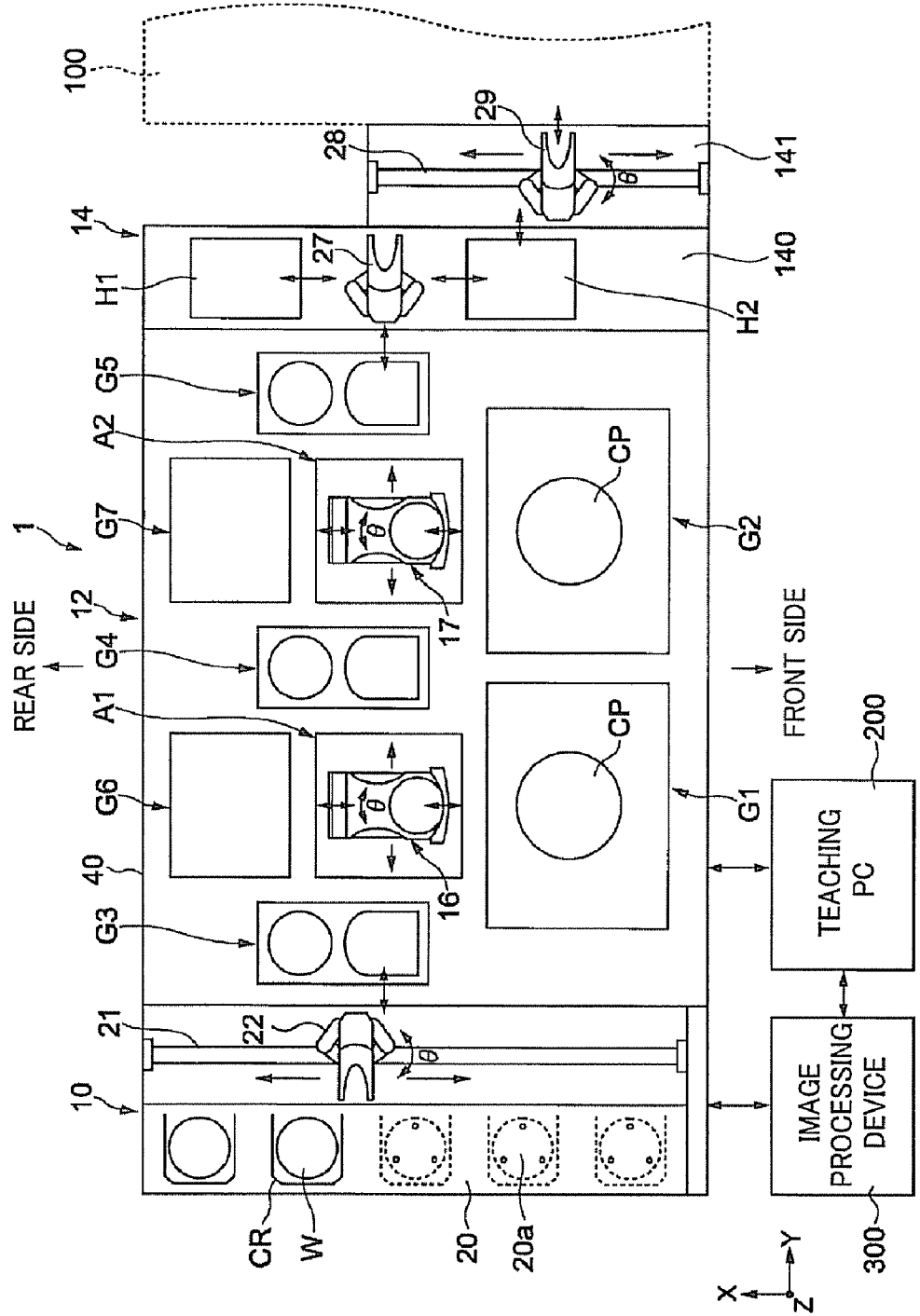
FIG. 1 is a plane view illustrating a schematic configuration of a coating and developing apparatus in accordance with an embodiment of the present invention.

1: Coating and developing apparatus
7a: First arm
7b: Second arm
7c: Third arm
22: Third wafer transfer unit
27: First wafer transfer unit
29: Second wafer transfer unit
200: Teaching personal computer
201: CPU
202: ROM
401: CCD camera disk
403: Target disk
405: Height adjustment disk
500: First position information
501, 600, 700: First compensation values
800: Second position information
900: Second compensation value
A1: First transfer unit
BAKE: High temperature heat treating unit
BARC: Bottom anti-reflective coating unit
COL: Cooling unit
COT: Resist coating unit
CHM: Chemical container
CPL: Cooling plate unit
DEV: Developing unit
PAB: Prebaking unit
PEB: Post exposure baking unit
POST: Post baking unit
SBU: Buffer cassette unit
TRS: Transition unit
WEE: Edge exposure unit

BEST MODE FOR CARRYING OUT THE INVENTION

Figure 2:
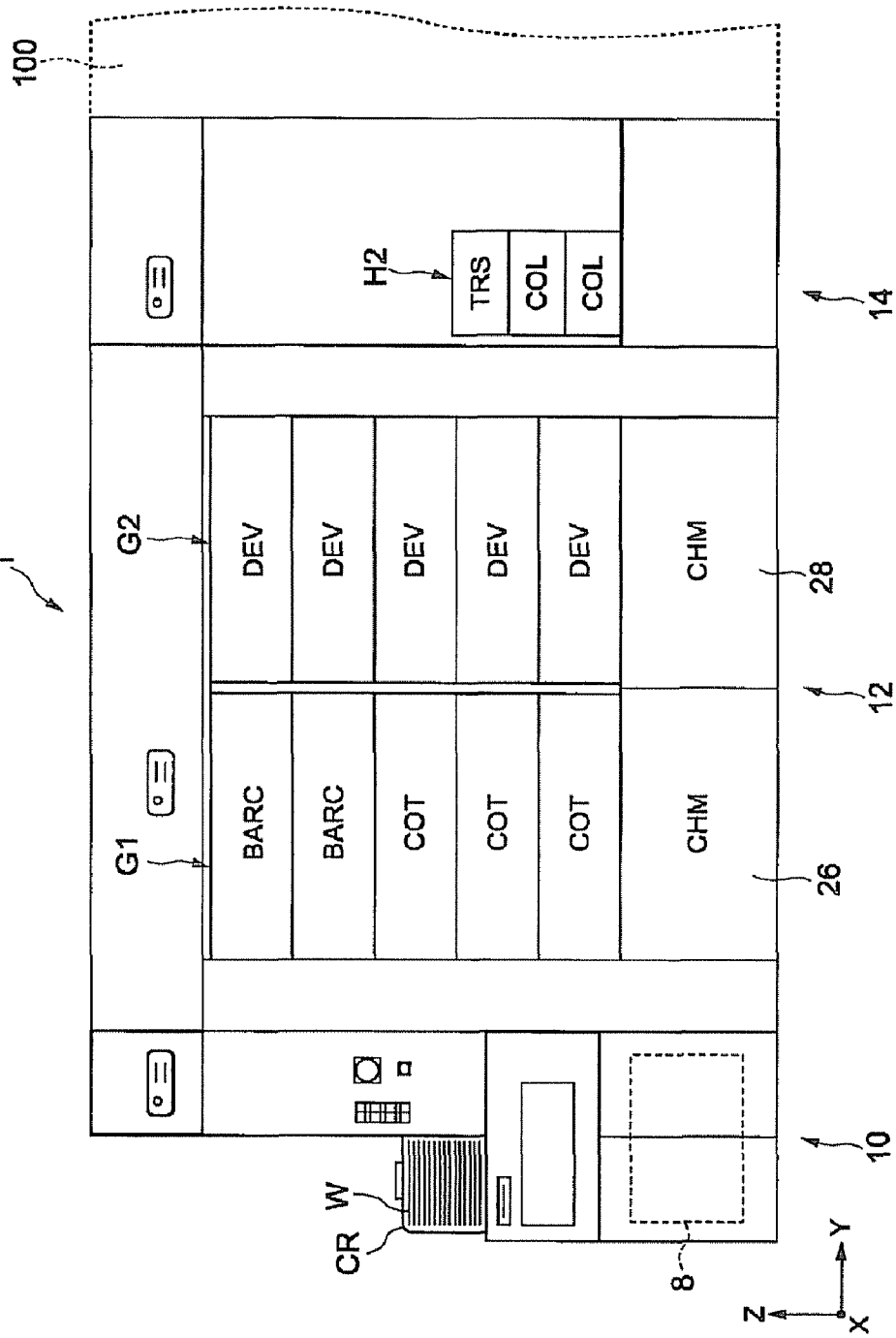
FIG. 2 is a front view of the coating and developing apparatus of FIG. 1.
Figure 3:
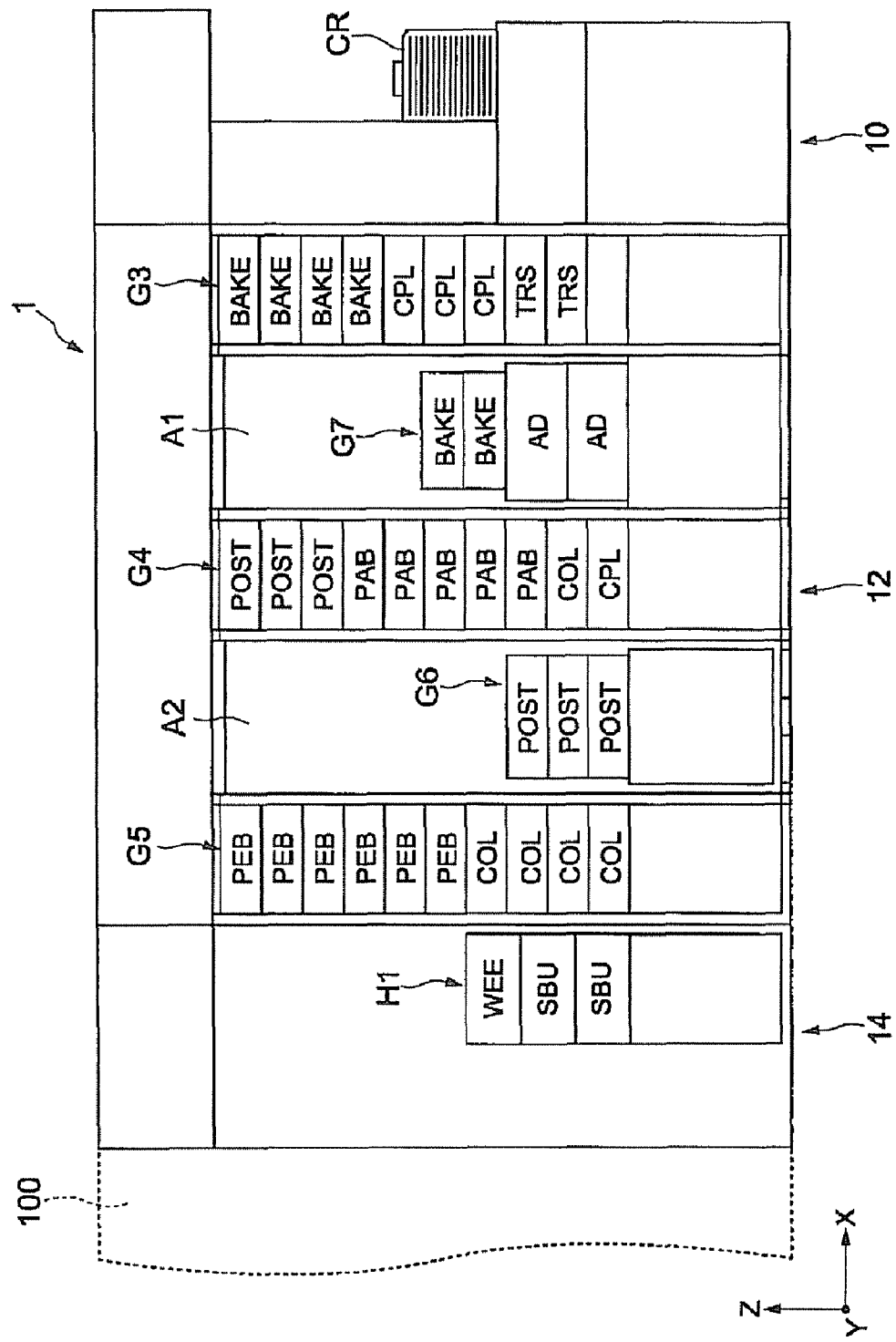
FIG. 3 is a rear view of the coating and developing apparatus of FIG. 1.

Hereinafter, embodiments of the present invention will be described. FIG. 1 is a plane view illustrating a schematic configuration of a coating and developing apparatus 1 as a substrate processing apparatus having a control device in accordance with an embodiment of the present invention. FIG. 2 presents a front view of the coating and developing apparatus 1 and FIG. 3 provides a rear view thereof.

As illustrated in FIG. 1, the coating and developing apparatus 1 includes, in a casing as a housing that encloses the entire apparatus, a cassette station 10, a processing station 12 and an interface section 14 connected as one body. The cassette station 10 loads and unloads, e.g., 25 sheets of wafers W as substrates in a cassette into and from the coating and developing apparatus 1 or loads and unloads the wafers W into and from a cassette CR. In the processing station 12, various processing units for performing single-wafer processes during a coating and developing process are arranged in multi-layers. The interface section 14 transfers the wafers W between the processing station 12 and an exposure apparatus 100 adjacent thereto.

In the cassette station 10, a plurality of cassettes CR may be arranged at preset positions on a cassette mounting table 20 in a row in an X direction (lengthwise direction of FIG. 1). A third wafer transfer unit 22 capable of moving on a transfer path 21 in the X direction is installed in the cassette station 10. The third wafer transfer unit 22 is also movable in a vertical direction and is capable of selectively accessing the wafers W arranged in the cassette CR in the vertical direction. Further, the third wafer transfer unit 22 is rotatable about a vertical axis (Θ direction) and is also capable of accessing units within a third processing unit set G3 in the processing station 12 to be described later.

The processing station 12 includes, as shown in FIG. 1, e.g., seven processing unit sets G1 to G7, each of which has a plurality of processing units arranged in multi-layers. The first processing unit set G1 and the second processing unit set G2 are arranged on the front side of the processing station 12, i.e., on the side of a negative X direction (lower part of FIG. 1), in sequence from the side of the cassette station 10. In a central region of the processing station 12, the third processing unit set G3, the fourth processing unit set G4 and the fifth processing unit set G5 are arranged in sequence from the side of the cassette station 10. Further, the sixth processing unit set G6 and the seventh processing unit set G7 are arranged on the rear side of the processing station 12, i.e., on the side of a positive X direction (upper part of FIG. 1), in sequence from the side of the cassette station 10.

A first transfer unit A1 is provided between the third processing unit set G3 and the fourth processing unit set G4. The first transfer unit A1 has an arm unit 16 which is rotatable in a Θ direction and is movable in a horizontal direction and a vertical direction. The first transfer unit A1 as a transfer device is capable of transferring wafers W between respective units in the first processing unit set G1, the third processing unit set G3, the fourth processing unit set G4 and the sixth processing unit set G6 by moving back and forth the arm unit 16 with respect to the respective units in the processing unit sets G1, G3, G4 and G6.

Further, a second transfer unit A2 is provided between the fourth processing unit set G4 and the fifth processing unit set G5. Like the first transfer unit A1, the second transfer unit A2 as a transfer device also has an arm 17. The second transfer unit A2 is capable of selectively accessing respective units in the second processing unit set G2, the fourth processing unit set G4, the fifth processing unit set G5 and the seventh processing unit set G7 and transferring wafers W therebetween.

As shown in FIG. 2, in the first processing unit set G1, liquid processing units for processing wafers W by supplying a liquid onto the wafers W, e.g., resist coating units COT for forming resist films by coating the wafers W with resist solutions are stacked in three levels, and bottom anti-reflective coating units (bottom coating units) BARC for forming bottom anti-reflection coating to prevent reflection of light during an exposure process are stacked in two levels in sequence from the bottom. In the second processing unit set G2, liquid processing units, e.g., developing units DEV for developing the wafers W are stacked in five levels in sequence from the bottom. Further, chemical containers CHM 26 and 28 for supplying various processing liquids into the liquid processing units within the processing unit sets G1 and G2 are installed at bottommost parts of the first processing unit set G1 and the second processing unit set G2, respectively.

As illustrated in FIG. 3, for example, in the third processing unit set G3, transition units TRS for transferring the wafers W, temperature control processing units (cooling plate units) CPL for performing a temperature control process on the wafers W and high-temperature heat treating units BAKE are stacked in nine levels in sequence from the bottom.

Further, in the fourth processing unit set G4, for example, a cooling plate unit CPL, a cooling unit COL for cooling the wafers W with high accuracy temperature control, prebaking units PAB for heating the wafers W after the resist coating process and post baking units POST for heating the wafers W after the developing process are stacked in ten levels in sequence from the bottom.

In the fifth processing unit set G5, for example, cooling units COL and post exposure baking units PEB as heat treating units for heating the wafers W after the exposure process are stacked in ten levels in sequence from the bottom. By way of example, each post exposure baking unit PEB includes, in a vessel, a heating plate for mounting and heating a wafer W thereon and a cooling plate for mounting and cooling the wafer W thereon, and, thus each post exposure baking unit PEB is capable of performing both heating and cooling of the wafer W.

In the sixth processing unit set G6, post baking units POST are stacked in three levels in sequence from the bottom, as illustrated in FIG. 3, for example.

In the seventh processing unit set G7, adhesion units AD for hydrophobicizing the wafers W and heat treating units BAKE for heating the wafers W are stacked in four levels in sequence from the bottom, as illustrated in FIG. 3, for example.

Referring back to FIG. 1, by way of example, the interface section 14 includes a first interface section 140 and a second interface section 141 in sequence from the side of the processing station 12. By way of example, a first wafer transfer unit 27 is provided in the first interface section 140 at a position corresponding to the fifth processing unit set G5. Provided at both sides of the first wafer transfer unit 27 in the X direction are, for example, two unit sets H1 and H2.

As illustrated in FIG. 3, in the unit set H1 on the side of the positive X direction, for example, buffer cassette units SBU as accommodation units and an edge exposure unit WEE for selectively exposing light only to an edge of a wafer W are stacked in sequence from the bottom. Meanwhile, in the unit set H2 on the side of the negative X direction, for example, cooling units COL and a transition unit TRS are stacked in sequence from the bottom, as shown in FIG. 2.

As depicted in FIG. 1, the first wafer transfer unit 27 is capable of moving in both the horizontal direction and the vertical direction and is also rotatable in the θ direction, for example. Thus, the first wafer transfer unit 27 is capable of accessing respective units within the fifth processing unit set G5, the unit set H1 and the unit set H2.

Installed in the second interface section 141 is, for example, a second wafer transfer unit 29 configured to move on a transfer path 28 provided in the X direction. The second wafer transfer unit 29 is capable of moving in a Z direction and is also rotatable in the θ direction. Thus, for example, the second wafer transfer unit 29 is capable of transferring the wafers W between the respective units within the unit set H2 and a transfer table within the exposure apparatus 100.

As illustrated in FIG. 1, the coating and developing apparatus 1 as the substrate processing apparatus in the present embodiment includes, a teaching personal computer (hereinafter, simply referred to as a "teaching PC") 200 as a control device for controlling wafer transfer positions of the first transfer unit A1, the second transfer unit A2, the first wafer transfer unit 27, the second wafer transfer unit 29 and the third wafer transfer unit 22 as transfer devices; and an image processing device 300 connected with the teaching PC 200.

Figure 5:
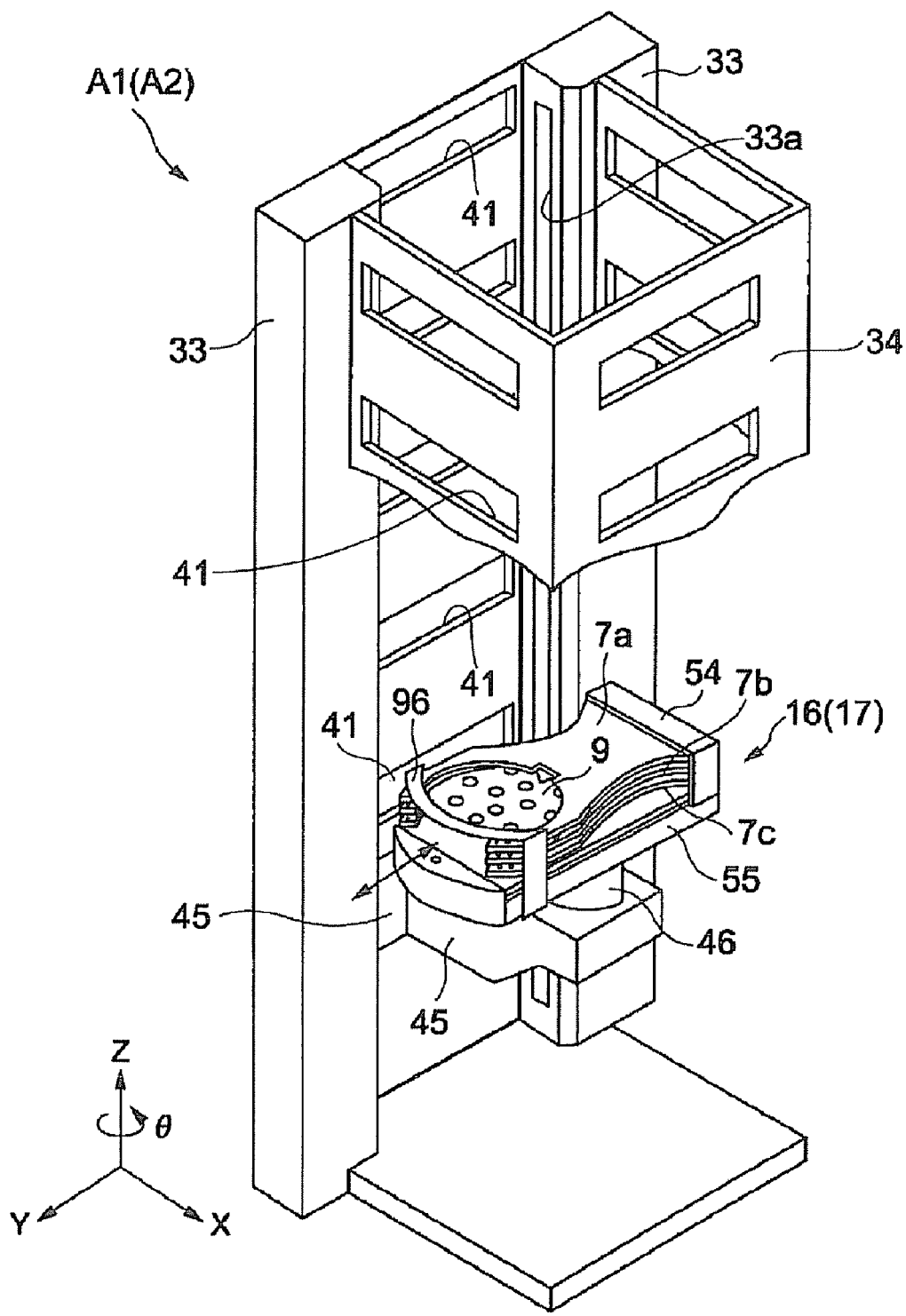
FIG. 5 is a perspective view of a transfer unit.

Referring to FIG. 5, the first transfer unit A1 (second transfer unit A2) includes an arm unit 16 (17); a rotational shaft 46 connected with the arm unit 16 (17) and allowing the arm unit 16 (17) to rotate in the θ direction on an xy plane; and a moving platform 45 connected with the rotational shaft 46 and capable of moving in a Z-axis direction. Further, the first transfer unit A1 (second transfer unit A2) has a guide rail 33; and a partition plate connected with the guide rail 33 and provided with a plurality of transfer ports 41. The arm unit 16 (17) has a plurality of, e.g., three arms including a first arm 7a, a second arm 7b and a third arm 7c for holding a wafer W thereon; a base 54 supporting the first to the third arms 7a to 7c while allowing them to move back and forth; and a support 55 holding the base 54. The rotational shaft 46 is connected with the support 55 of the arm unit 16 (17). Transfer ports 41 are provided in the Z-axis diction at each of four different lateral sides of the partition plate 34 of a rectangular shape, and the transfer ports 41 are configured as wafer transfer ports through which wafers are transferred into respective processing units. As the moving platform 45 slides along a groove 33a provided in the guide rail 33 in the Z-axis direction, the first arm 7a, the second arm 7b and the third arm 7c can be moved in the vertical direction (Z-axis direction). Moreover, since the rotational shaft 46 is rotatable in the θ direction, directions of the first arm 7a, the second arm 7b and the third arm 7c on a horizontal plane can be altered. Thus, wafers W can be transferred into the processing units through the transfer ports 41 by using the first arm 7a, the second arm 7b and the third arm 7c. Each of the first arm 7a, the second arm 7b and the third arm 7c is configured to hold a wafer W thereon.

Prior to processing the wafers W by using the coating and developing apparatus 1, the teaching PC 200 as the control device calculates a deviation amount between a transfer position of a jig and a preset transfer target position in each of the first transfer unit A1, the second transfer unit A2, the first wafer transfer unit 27, the second wafer transfer unit 29 and the third wafer transfer unit 22 by using the jig formed in the shape of wafer W. Then, based on the calculated deviation amount, the teaching PC 200 adjusts a transfer position so as to allow the arm of each transfer unit to transfer the wafer W to the transfer target position.

As stated above, each of the first transfer unit A1 and the second transfer unit A2 has three arms. Meanwhile, each of the first wafer transfer unit 27, the second wafer transfer unit 29 and the third wafer transfer unit 22 has a single arm.

Figure 4:
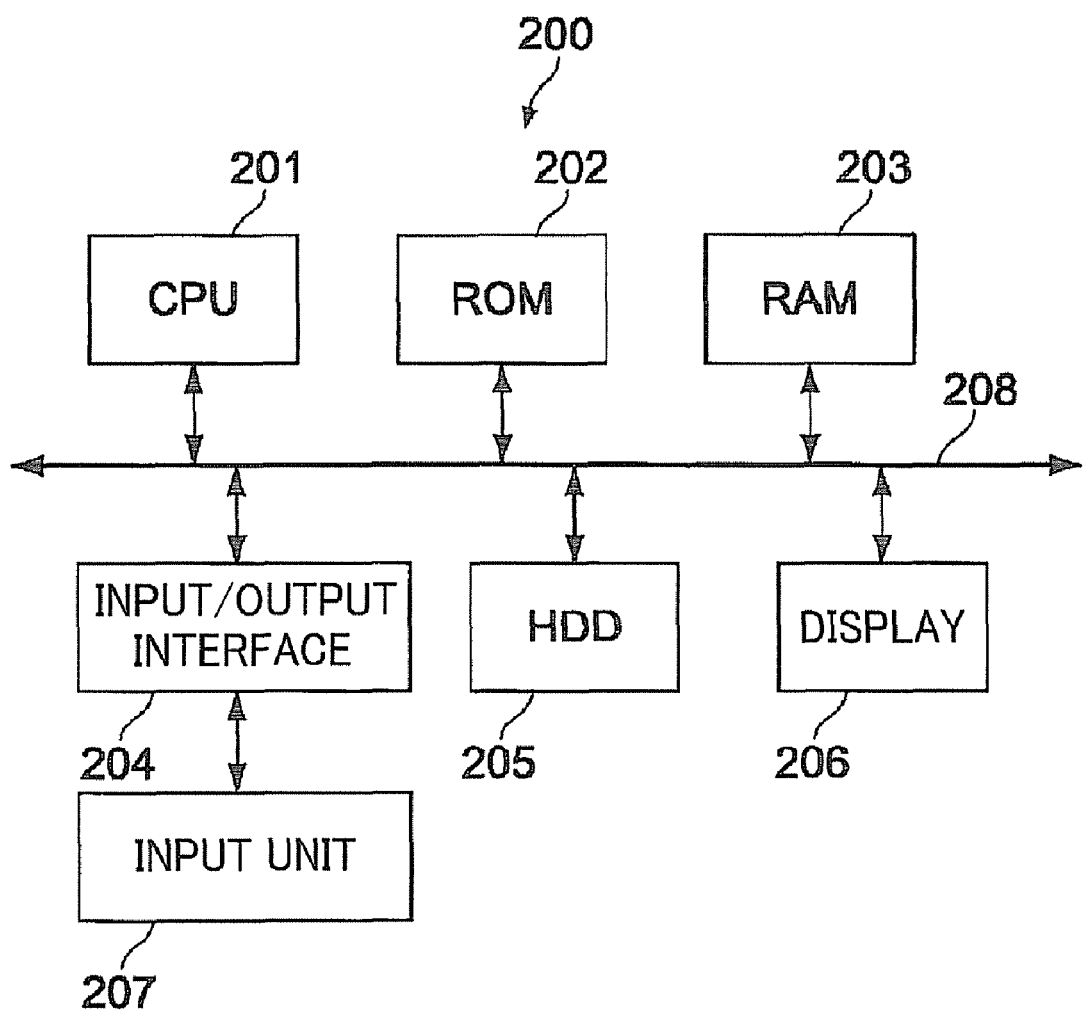
FIG. 4 illustrates a PC for teaching.

In the present embodiment, the teaching PC 200 includes, as depicted in FIG. 4, an input unit 207 such as a key board; a display 206 showing an operation screen for teaching; a CPU (Central Processing Unit) 201; a ROM (Read Only Memory) 202; a RAM (Random Access Memory) 203; a HDD (Hard Disk Drive) 205; a bus 208; and an input/output interface 204. Data is exchanged between the CPU 201, the ROM 202, the RAM 203, the input/output interface 204, the HDD 205 and the display 206 via the bus 208. Through an input of a user, the input unit 207 is connected with the bus 208 via the input/output interface 204.

The ROM 202 is a storage unit that stores therein first position information indicating relative positions between one reference processing unit selected from a plurality of processing units accessed by a single transfer unit and the other non-reference processing units.

The CPU 201 serves as a first calculation unit that calculates a first compensation value for compensating a position deviation between a transfer position of a jig on a transfer unit with respect to a reference processing unit and a preset first transfer target position in case that the transfer unit holding thereon the jig formed in the shape of a wafer W transfers the jig. Further, the CPU 201 also serves as a second calculation unit that calculates, based on the first compensation value and the first position information, a second compensation value for compensating a position deviation between a jig transfer position of the transfer unit with respect to a non-reference processing unit and a preset second transfer target position.

That is, in the CPU 201, the first calculation unit calculates the first compensation value for each arm with respect the reference processing unit, and the second calculation unit calculates the second compensation value for each arm with respect to the non-reference processing unit. Further, in case that the transfer unit has a plurality of arms, second position information indicating relative positions between the arms is calculated by the CPU 201 based on the first compensation values of the respective arms with respect to the reference processing unit.

The RAM 203 is a storage unit that temporarily stores therein the first compensation values and the second position information for operation in the CPU 201.

The HDD 205 is a storage unit that stores therein the calculated first and second compensation values. The position of each arm of each transfer unit is adjusted based on the first and second compensation values so that they can transfer a wafer W to a transfer target position. Furthermore, software for executing a position adjustment process (hereinafter, simply referred to as an "adjustment software") in accordance with the present embodiment is also stored in the HDD 205.

In the input unit 207, a first user input for selecting the reference processing unit from the processing units and a second user input for changing the selected reference unit may be inputted. Accordingly, even in case that there is a problem in the selected reference processing unit, the reference processing unit can be changed, and, thus, the position deviation compensating process can be carried out successfully.

Figure 6:
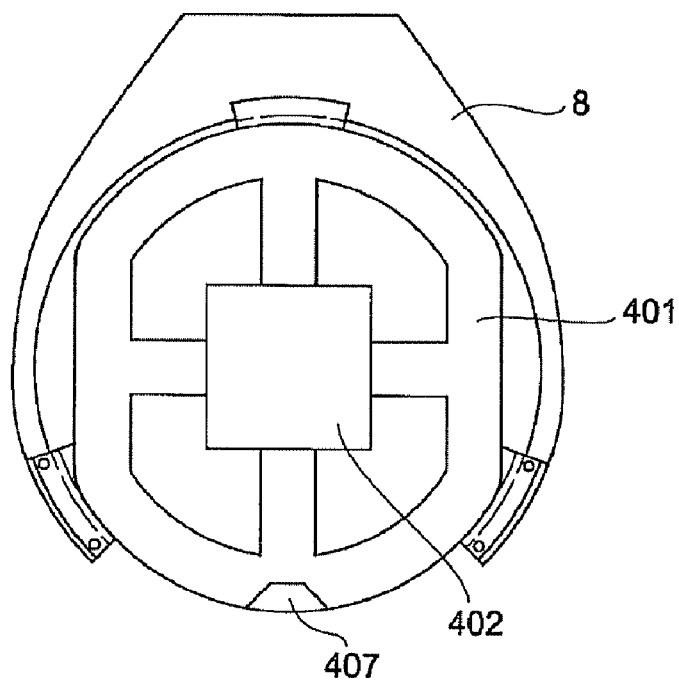
FIG. 6 is a plane view of a CCD camera disk.

Now, the jigs formed in the shape of wafer W to be used in performing the position alignment process will be explained with reference to FIGS. 6 to 8. In the present embodiment, three types of jigs are used. FIGS. 6 and 8 provide plane views of the three types of jigs held on arms.

As shown in FIG. 6, a first jig is a CCD camera disk 401 having a substantially circular exterior shape similar to a circular shape of a wafer W. This CCD camera disk 401 is provided with a CCD camera 402 as an imaging unit at the center thereof and is also provided with a slit sensor 407 at its portion corresponding to a front end in a transfer direction of the CCD camera disk 401 when the CCD camera disk 401 is transferred into a processing unit. The CCD camera disk 401 is held on, e.g., a teaching arm 8 (not shown in FIG. 5) installed in the transfer unit A1 (A2) shown in FIG. 5. While the CCD camera disk 401 is held on the teaching arm 8, the CCD camera 402 is capable of capturing an image of a region below the CCD camera disk 401. The CCD camera 402 is connected with the image processing device 300, and the image data captured by the CCD camera 402 is processed by the image processing device 300. Further, the slit sensor 407 detects presence or absence of an object on the way and is used in detecting the transfer ports 41 of the partition plate 34 through which wafers W would be transferred into the processing units.

Figure 7:
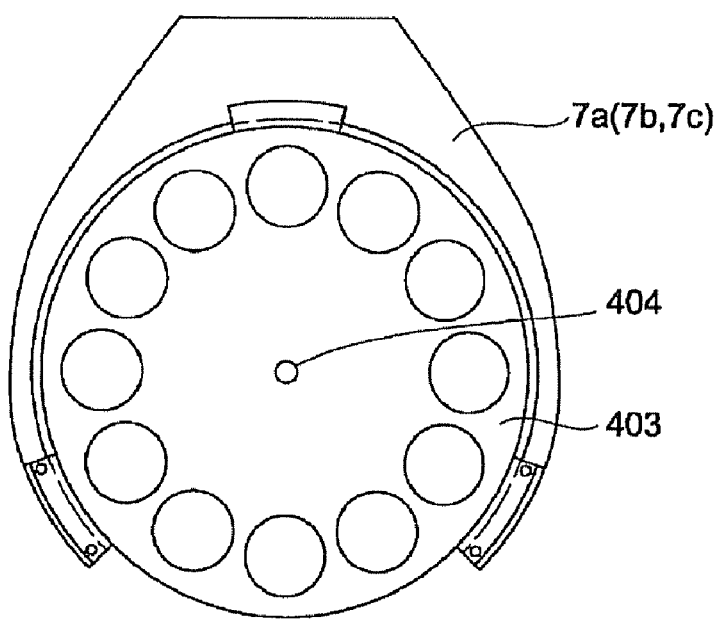
FIG. 7 is a plain view of a target disk.
Figure 8:
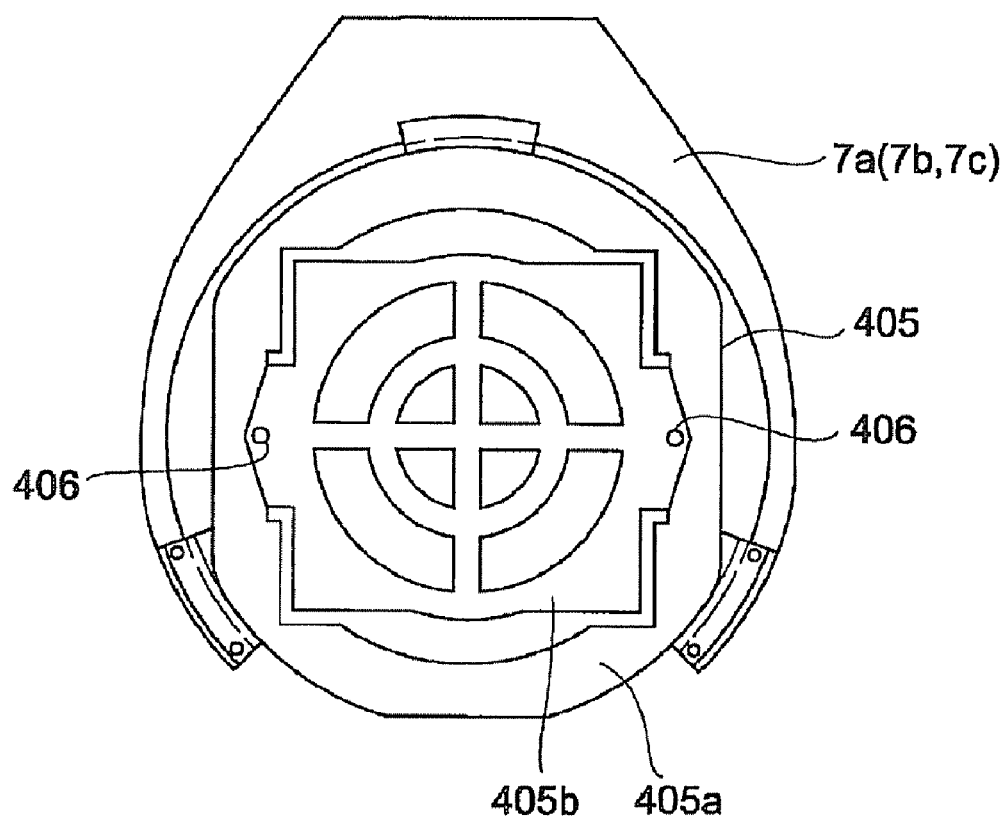
FIG. 8 is a plane view of a height adjustment disk.
Figure 9:
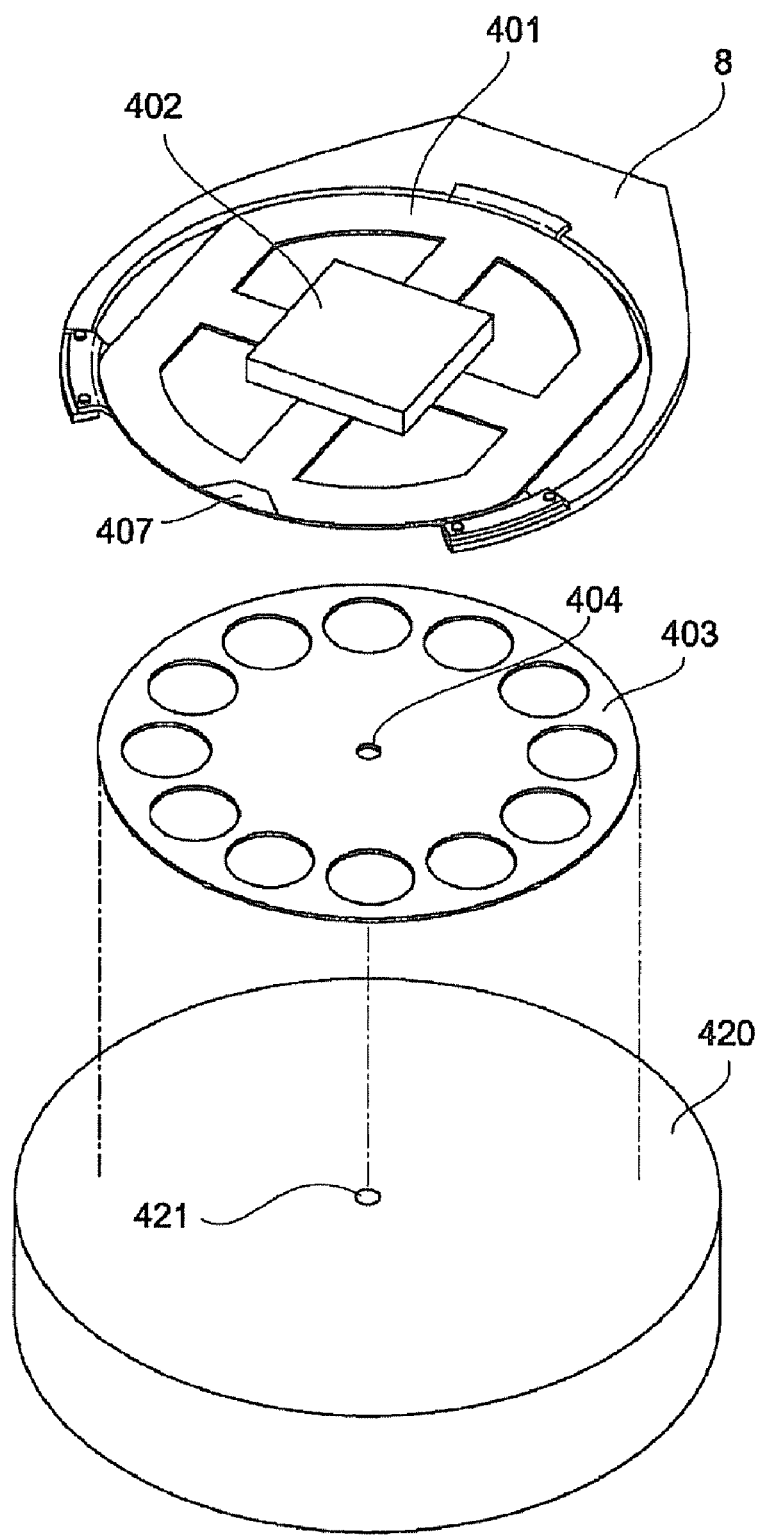
FIG. 9 is a schematic perspective view illustrating position alignment using the target disk.

Referring to FIG. 7, a second jig is a target disk 403 having a circular exterior shape similar to a circular wafer W and is provided with a circular hole 404 at its center. As shown in FIG. 9, in the processing unit, a mark 421 is formed at a position corresponding to a center of a wafer transfer target position. When viewed from the top, the mark 421 is positioned in the hole 404 of the target disk 403 when the target disk 403 is mounted on a mounting table 420 in the processing unit. After the target disk 403 is mounted on the mounting table 420 in the processing unit, the CCD camera disk 401 held on the teaching arm 8 is transferred into the processing unit, and images of the mark 421 and the hole 404 are captured by the CCD camera 402. The captured images are processed by the image processing device 300. If an actual wafer transfer position coincides with the wafer transfer target position without the position deviation, the mark would be positioned in the center of the hole 404. If an actual wafer transfer position is deviated from the wafer transfer target position, the mark would not be positioned in the center of the hole 404. If such a position deviation occurs, a user may adjust the position deviation by moving the target disk 403 so as to allow the mark 421 to be located in the center of the hole 404 while seeing images displayed on a monitor after processed by the image processing device 300. In this way, a first compensation value for compensating a position deviation on a horizontal plane in an xy axis direction and a θ direction can be calculated.

Referring to FIG. 8, a third jig is a height adjustment disk 405 having a substantially circular exterior shape similar to a circular shape of a wafer W. The height adjustment disk 405 includes a ring-shaped outer disk 405a and an inner disk 405b having an exterior shape substantially the same as the shape of a hole at the center of the outer disk 405a. The outer disk 405a and the inner disk 405b are partially overlapped, and they can be spaced apart from each other. Further, two sensors are provided at the outer disk 405a opposite to each other with respect to the center hole therebetween. By using the height adjustment disk 405, it is possible to calculate a first compensation value for compensating a position deviation between a wafer transfer position and a first transfer target position in a height direction of the wafer transfer position, i.e., in the Z axis direction.

Below, a method for adjusting a position of an arm by using the above-described three types of jigs in, for example, the first transfer unit A1 having the three arms will be explained with reference to FIGS. 4 to 11.

Figure 10:
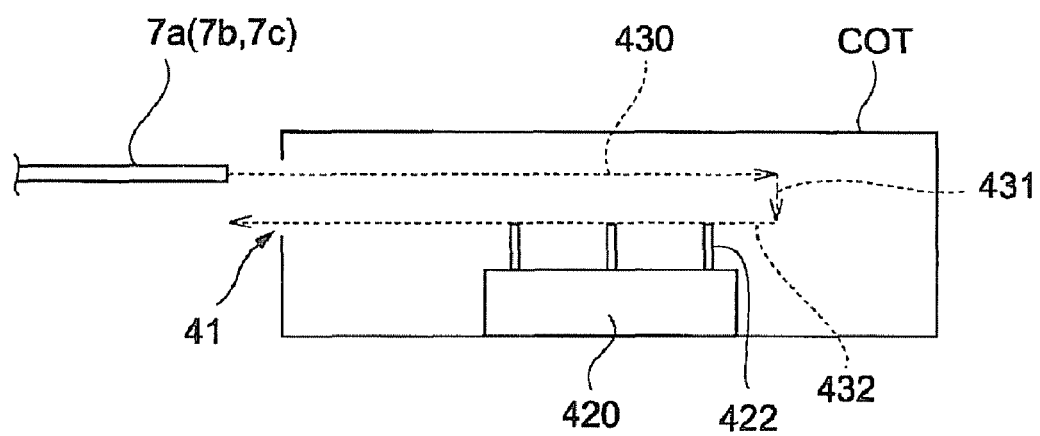
FIG. 10 is a schematic cross sectional view of a resist coating unit.
Figure 11:
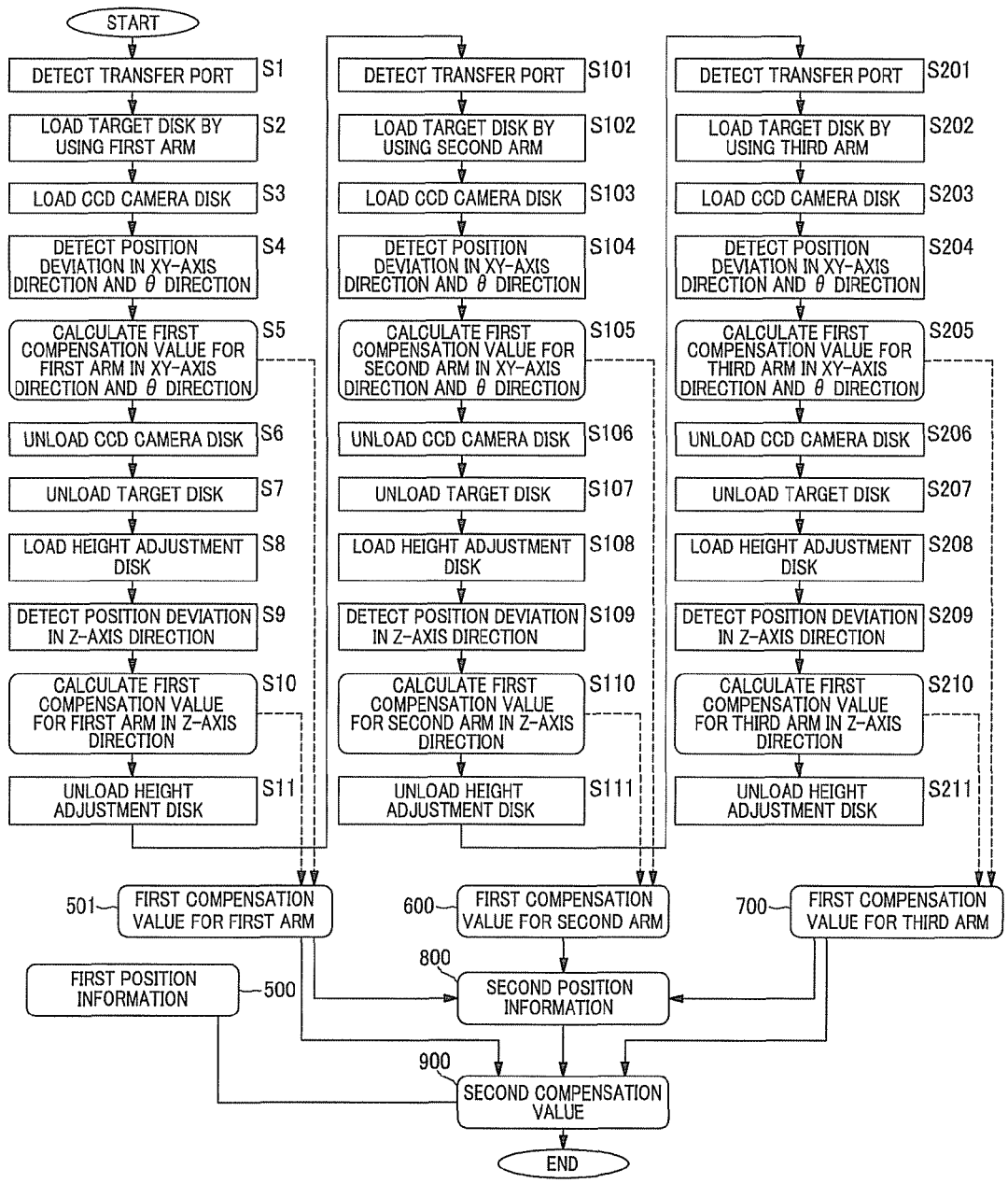
FIG. 11 presents a flowchart to describe a position aligning process.

FIG. 9 is a schematic perspective view illustrating the inside of a resist coating unit COT in case of using the CCD camera disk 401 and the target disk 403. FIG. 10 is a schematic cross sectional view illustrating the inside of the resist coating unit COT. FIG. 11 provides a flowchart to describe a position adjusting process.

As shown in FIG. 10, installed in the resist coating unit COT is a mounting table 420 that attracts and holds a rear surface of a wafer W. The mounting table 420 is provided with three supporting pins 422 configured to be movable up and down. In a raised position, the supporting pins 422 are protruded from the mounting table 420. In a lowered position, the supporting pins 422 are retracted below the mounting table 420. Further, a coating solution supply nozzle (not shown) for coating a film on the wafer W is also installed in the resist coating unit COT.

In the present embodiment, one of the three resist coating units COT in the processing unit set G1 accessed by the first transfer unit A1 is selected as a reference processing unit. The rest processing units in the processing unit set G1 and the processing units in the other processing unit sets G3, G4 and G6 become non-reference processing units. Further, in the present embodiment, although the resist coating unit COT is selected as the reference processing unit, another processing unit may be appropriately selected by the user.

Now, a position adjusting process will be described with reference to the flowchart of FIG. 11.

In the ROM 202, first position information 500 indicating relative positions between the reference processing unit and the rest non-reference processing units accessed by the transfer unit A1 is previously stored.

First, the adjustment software is executed on the teaching PC. Further, the CCD camera disk 401 is held on the teaching arm 8, and the target disk 403 is held on the first arm 7a. Each of the following processes is performed in response to instructions of the adjustment software, and an operation status is displayed on the display 206. For example, a processing unit currently under the position adjustment process, or position information of the jigs or each arm may be displayed.

Then, as shown in FIG. 10, a transfer port 41 that allows an access to the inside of the resist coating unit COT as the reference processing unit is detected by the slit sensor 407 on the CCD camera disk 401 held on the teaching arm 8 (S1).

Thereafter, while the three supporting pins 422 are protruded from the mounting table 420, the first arm 7a is driven, and the target disk 403 is transferred into the resist coating unit COT in the direction of an arrow 430. Then, the first arm 7a is lowered in the direction of an arrow 431, and the target disk 403 is transferred onto the three supporting pins 422. Thereafter, the first arm 7a is retreated out of the resist coating unit COT. Here, a position at which the jig is held on the supporting pins 422 protruded from the mounting table 420 becomes a wafer transfer position. A desired transfer position at which the wafer W is supposed to be located in the resist coating unit COT as the reference processing unit becomes a first transfer target position. Subsequently, the three supporting pins 422 are lowered and retracted below the mounting table 420, and the target disk 403 is mounted on the mounting table 420 (S2).

Afterward, as illustrated in FIG. 9, by driving the teaching arm 8 while the target disk 403 is held on the mounting table 420, the CCD camera disk 401 is transferred into the resist coating unit COT (S3). Then, images of the mark 421 formed in the resist coating unit COT and the hole 404 of the target disk 403 are captured by the CCD 402 of the CCD camera disk 401, and the captured images are processed by the image processing device 300. As a result of the image processing, a position deviation between the first transfer target position and an actual transfer position for the wafer W on a horizontal plane in an XY-axis direction and in a e direction is detected (S4), and a first compensation value 501 for the first arm 7a in the XY-axis direction and in the direction is calculated by the CPU 201 (S5). The calculated first compensation value 501 in the XY-axis direction and in the θ direction is stored in the RAM 203 and the HDD 205.

Subsequently, by driving the teaching arm 8 while the CCD camera disk 401 is held thereon, the CCD camera disk 401 is taken out of the resist coating unit COT (S6). Then, the three supporting pins 422 are raised, and the first arm 7a is moved into the resist coating unit COT. The first arm 7a receives the target disk 403 held on the three supporting pins 422 and takes the target disk 403 out of the resist coating unit COT while holding it (S7).

Then, the user removes the target disk 403 held on the first arm 7a and mounts the height adjustment disk 405 on the first arm 7a instead.

While the supporting pins 422 are protruded from the mounting table 420, i.e., located at a transfer position, the first arm 7a is then driven and the height adjustment disk 405 is transferred into the resist coating unit COT in the direction of the arrow 430 to be positioned above the mounting table 420

(S8). Afterward, the first arm 7a is driven to be lowered in the direction of the arrow 431, and, thus, the inner disk 405b of the height adjustment disk 405 is mounted on the supporting pins 422 while the edge of the outer disk 405a is held on the first arm 7a. Thereafter, the first arm 7a is further lowered as much as a distance exceeding the thickness of the inner disk 405b, and, thus, the outer disk 405a and the inner disk 405b are spaced apart from each other. At this time, supporting positions and inclination of the three supporting pins 422 are detected from variation of an output signal of two optical sensors 406. In this way, a position deviation amount between the first transfer target position and the actual wafer transfer position in a Z-axis direction is detected (S9), and a first compensation value 502 for the first arm 7a in the Z-axis direction is calculated by the CPU 201 (S10). The calculated first compensation value 502 in the Z-axis direction is stored in the RAM 203 and the HDD 205.

Subsequently, the first arm 7a is raised to receive the inner disk 405b held on the supporting pins 422, and the outer disk 405a and the inner disk 405b are overlapped again, and, thus, the height adjustment disk 405 is returned to its original state before the outer and inner disks 405a and 405b are spaced apart from each other. Then, the supporting pins 422 and the height adjustment disk 405 are distanced apart from each other by raising the first arm 7a, and, then, the first arm 7a is moved in a horizontal direction. Accordingly, the height adjustment disk 405 is taken out of the resist coating unit COT.

Through the above-described process, calculation of the first compensation value 501 for the first arm 7a with respect to the reference unit is completed.

Subsequently, the user mounts the target disk 403 on the second arm 7b.

Then, a transfer port 41 that allows an access to the inside of the resist coating unit COT as the reference processing unit is detected by the slit sensor 407 on the CCD camera disk 401 held on the teaching arm 8 (S101).

Thereafter, while the three supporting pins 422 are protruded from the mounting table 420, the second arm 7b is driven, and the target disk 403 is transferred into the resist coating unit COT in the direction of the arrow 430. Then, the second arm 7b is lowered in the direction of the arrow 431, and the target disk 403 is transferred onto the three supporting pins 422. Thereafter, the second arm 7b is retreated out of the resist coating unit COT. Here, a position at which the jig is held on the supporting pins 422 protruded from the mounting table 420 becomes a wafer transfer position. A desired transfer position at which the wafer W is supposed to be located in the resist coating unit COT as the reference processing unit becomes a first transfer target position. Subsequently, the three supporting pins 422 are lowered and retracted below the mounting table 420, and the target disk 403 is mounted on the mounting table 420 (S102).

Afterward, as illustrated in FIG. 9, by driving the teaching arm 8 while the target disk 403 is held on the mounting table 420, the CCD camera disk 401 is transferred into the resist coating unit COT (S103). Then, images of the mark 421 formed in the resist coating unit COT and the hole 404 of the target disk 403 are captured by the CCD 402 of the CCD camera disk 401, and the captured images are processed by the image processing device 300. As a result of the image processing, a position deviation between the first transfer target position and an actual transfer position for the wafer W on a horizontal plane in an XY-axis direction and in a θ direction is detected (S104), and a first compensation value 601 for the second arm 7b in the XY-axis direction and in the θ direction is calculated by the CPU 201 (S105). The calculated first compensation value 601 in the XY-axis direction and in the θ direction is stored in the RAM 203 and the HDD 205.

Subsequently, by driving the teaching arm 8 while the CCD camera disk 401 is held thereon, the CCD camera disk 401 is taken out of the resist coating unit COT (S106). Then, the three supporting pins 422 are raised, and the second arm 7b is moved into the resist coating unit COT. The second arm 7b receives the target disk 403 held on the three supporting pins 422 and takes the target disk 403 out of the resist coating unit COT while holding it (S107).

Then, the user removes the target disk 403 held on the second arm 7b and mounts the height adjustment disk 405 on the second arm 7b instead.

Thereafter, while the supporting pins 422 are protruded from the mounting table 420, i.e., located at the transfer position, the second arm 7b is driven and the height adjustment disk 405 is transferred into the resist coating unit COT in the direction of the arrow 430 to be positioned above the mounting table 420 (S108). Afterward, the second arm 7b is driven to be lowered in the direction of the arrow 431, and, thus, the inner disk 405b of the height adjustment disk 405 is mounted on the supporting pins 422 while the edge of the outer disk 405a is held on the second arm 7b. Thereafter, the second arm 7b is further lowered as much as a distance exceeding the thickness of the inner disk 405b, and, thus, the outer disk 405a and the inner disk 405b are spaced apart from each other. At this time, supporting positions and inclination of the three supporting pins 422 are detected from variation of an output signal of the two optical sensors 406. In this way, a position deviation amount between the first transfer target position and the actual wafer transfer position in a Z-axis direction is detected (S109), and a first compensation value 602 for the second arm 7b in the Z-axis direction is calculated by the CPU 201 (S110). The calculated first compensation value 602 in the Z-axis direction is stored in the RAM 203 and the HDD 205.

Subsequently, the second arm 7b is raised to receive the inner disk 405b held on the supporting pins 422, and the outer disk 405a and the inner disk 405b are overlapped again, and, thus, the height adjustment disk 405 is returned to its original state before the outer and inner disks 405a and 405b are spaced apart from each other. Then, the supporting pins 422 and the height adjustment disk 405 are distanced apart from each other by raising the second arm 7b, and, then, the second arm 7b is moved in the horizontal direction. Accordingly, the height adjustment disk 405 is taken out of the resist coating unit COT.

Through the above-described process, calculation of a first compensation value 600 for the second arm 7b with respect to the reference unit is completed.

Subsequently, the user mounts the target disk 403 on the third arm 7c.

Then, a transfer port 41 that allows an access to the inside of the resist coating unit COT as the reference processing unit is detected by the slit sensor 407 on the CCD camera disk 401 held on the teaching arm 8 (S201).

Thereafter, while the three supporting pins 422 are protruded from the mounting table 420, the third arm 7c is driven, and the target disk 403 is transferred into the resist coating unit COT in the direction of the arrow 430. Then, the third arm 7c is lowered in the direction of the arrow 431, and the target disk 403 is transferred onto the three supporting pins 422. Thereafter, the third arm 7c is retreated out of the resist coating unit COT. Here, a position at which the jig is held on the supporting pins 422 protruded from the mounting table 420 becomes a wafer transfer position. A desired transfer position at which the wafer W is supposed to be located in the resist coating unit COT as the reference processing unit becomes a first transfer target position. Subsequently, the three supporting pins 422 are lowered and retracted below the mounting table 420, and the target disk 403 is mounted on the mounting table 420 (S202).

Afterward, as illustrated in FIG. 9, by driving the teaching arm 8 while the target disk 403 is held on the mounting table 420, the CCD camera disk 401 is transferred into the resist coating unit COT (S203). Then, images of the mark 421 formed in the resist coating unit COT and the hole 404 of the target disk 403 are captured by the CCD 402 of the CCD camera disk 401, and the captured images are processed by the image processing device 300. As a result of the image processing, a position deviation between the first transfer target position and an actual transfer position for the wafer W on a horizontal plane in an XY-axis direction and in a θ direction is detected (S204), and a first compensation value 701 for the third arm 7c in the XY-axis direction and in the θ direction is calculated by the CPU 201 (S205). The calculated first compensation value 701 in the XY-axis direction and in the θ direction is stored in the RAM 203 and the HDD 205.

Subsequently, by driving the teaching arm 8 while the CCD camera disk 401 is held thereon, the CCD camera disk 401 is taken out of the resist coating unit COT (S206). Then, the three supporting pins 422 are raised, and the third arm 7c is moved into the resist coating unit COT. The third arm 7c receives the target disk 403 held on the three supporting pins 422 and takes the target disk 403 out of the resist coating unit COT while holding it (S207).

Then, the user removes the target disk 403 held on the third arm 7c and mounts the height adjustment disk 405 on the third arm 7c instead.

Thereafter, while the supporting pins 422 are protruded from the mounting table 420, i.e., located at the transfer position, the third arm 7c is driven and the height adjustment disk 405 is transferred into the resist coating unit COT in the direction of the arrow 430 to be positioned above the mounting table 420 (S208). Afterward, the third arm 7c is driven to be lowered in the direction of the arrow 431, and, thus, the inner disk 405b of the height adjustment disk 405 is mounted on the supporting pins 422 while the edge of the outer disk 405a is held on the third arm 7c. Thereafter, the third arm 7c is further lowered as much as a distance exceeding the thickness of the inner disk 405b, and, thus, the outer disk 405a and the inner disk 405b are spaced apart from each other. At this time, supporting positions and inclination of the three supporting pins 422 are detected from variation of an output signal of the two optical sensors 406. In this way, a position deviation amount between the first transfer target position and the actual wafer transfer position in a Z-axis direction is detected (S209), and a first compensation value 702 for the third arm 7c in the Z-axis direction is calculated by the CPU 201 (S210). The calculated first compensation value 702 in the Z-axis direction is stored in the RAM 203 and the HDD 205.

Subsequently, the third arm 7c is raised to receive the inner disk 405b held on the supporting pins 422, and the outer disk 405a and the inner disk 405b are overlapped again, so that the height adjustment disk 405 is returned to its original state before the outer and inner disks 405a and 405b are spaced apart from each other. Then, after the supporting pins 422 and the height adjustment disk 405 are distanced apart from each other by raising the third arm 7c, the third arm 7c is moved in the horizontal direction. Accordingly, the height adjustment disk 405 is taken out of the resist coating unit COT.

Through the above-described process, calculation of a first compensation value 700 for the third arm 7c with respect to the reference unit is completed.

In the CPU 201, second position information 800 indicating relative positions of the three arms 7a, 7b and 7c is calculated from the first compensation values 501, 600 and 700 which are temporarily stored in the RAM 203, respectively. The second position information 800 is temporarily stored in the RAM 203. Further, a second compensation value 900 for each arm with respect to each non-reference processing unit is also calculated by the CPU 201 based on the first compensation values 501, 600 and 700 and the second position information 800 temporarily stored in the RAM 203 and the first position information 500 stored in the ROM 202. The calculated second compensation values 900 are stored in the HDD 205.

Based on the first compensation values 501, 600 and 700 and the second compensation values 900 stored in the HDD 205, a transfer position for each arm for each processing unit can be adjusted. This position adjusting process is automatically performed by the adjustment software. During the position adjusting process, information including a processing unit and an arm currently under the position adjustment, a processing unit and an arm of which position adjustment has been normally completed, a processing unit and an arm of which position adjustment has been abnormally completed, and so forth, is displayed on the display 206 by the adjustment software (not shown).

In the present embodiment as described above, the position deviation amount of the wafer transfer position from the first wafer transfer target position between the reference processing unit and the transfer unit is deemed to be the same as the position deviation amount of the wafer transfer position from the second wafer transfer target position between the non-reference processing unit and the same transfer unit. The first compensation value for compensating the position deviation of the wafer transfer position from the first wafer transfer target position between the reference processing unit and the transfer unit is calculated for each arm. Then, the second compensation value for compensating the position deviation of the wafer transfer position from the second wafer transfer target position between the non-reference processing unit and the transfer unit can be calculated for each arm based on the first compensation value, the first position information indicating the relative position between the reference processing unit and the non-reference processing unit and the second position information indicating the relative positions between the arms. Accordingly, since a position deviation between a wafer transfer position and a wafer transfer target position need not be detected for each arm for each processing unit, time required for the position adjustment of the arms can be greatly reduced. By way of example, in case that the transfer unit accesses ten processing units with three arms, conventionally, the position adjustment process needs to be performed 30 times if the position adjustment is performed for each arm. In the present embodiment, however, the position adjustment operation (first compensation value calculating process) is performed only three times, and the other 27 times of position adjustment processes can be automatically performed by the adjustment software by using the first compensation values without having to calculate a position deviation amount for each case.

In the present embodiment as described above, the position deviation amount of the wafer transfer position from the first wafer transfer target position between the reference processing unit and the transfer unit is deemed to be the same as the position deviation amount of the wafer transfer position from the second wafer transfer target position between the non-reference processing unit and the same transfer unit. In addition, if it is deemed that position deviation amounts between the wafer transfer position and the wafer transfer target position for the plurality of arms installed in the same transfer unit are same, the first compensation value may be calculated for only one arm selected from the plurality of arms by using the jigs as in the above-described position adjusting operation, and the first compensation values for the other arms may be calculated from the first compensation value for the selected one arm and the second position information indicating the relative positions between the arms. Thus, the position adjustment operation need not be performed for each arm, so that time required for the position adjustment of the arms can be further reduced.

In such a case, when the transfer unit accesses ten processing units with three arms, only one position adjustment operation (first compensation value calculating process) is performed for the selected single arm of the reference processing unit, and the other 29 times of position adjustment processes can be automatically performed by the adjustment software by using the first compensation value. Further, in this case, the second position information indicating the relative positions between the arms is previously stored in the ROM 202.

In the above-discussed embodiment, the teaching arm 8 is used to hold the CCD camera disk 401. In case that the position adjustment operation is performed in a transfer unit having the three arms 7a, 7b and 7c without having the teaching arm, the CCD camera disk 401 may be held on, e.g., the arm 7a, and the position adjustment operation for the other arms 7a and 7b may be then performed. Thereafter, the CCD camera disk 401 may be held on the other arm, e.g., the arm 7b, and the position adjustment operation for the arm 7a may be carried out.

Further, in case that the position adjustment operation is performed in the transfer unit having the three arms 7a, 7b and 7c without having the teaching arm, the operation may be performed in the following sequence as specified below. For instance, the CCD camera disk, the target disk and the height adjustment disk are held on the arm 7a, the arm 7b and the arm 7c, respectively. Then, a first compensation value for the arm 7b on a horizontal plane and a first compensation value for the arm 7c in a Z-axis direction are calculated. Then, after the disks held on the arm 7b and the arm 7c are exchanged, a first compensation value for the arm 7b in the Z-axis direction and a first compensation value for the arm 7c on the horizontal plane are calculated. Subsequently, the target disk is held on the arm 7a, while the CCD camera disk is held on the arm 7b. Then, a first compensation value for the arm 7a on the horizontal plane is calculated. Afterward, the disk on the arm 7a is replaced with the height adjustment disk, and the first compensation value for the arm 7a in the Z-axis direction is calculated. By following this process sequence, the first compensation values for the respective arms can be calculated without using the teaching arm, so that a manufacturing cost can be reduced.

Furthermore, in each of the first wafer transfer unit 27, the second wafer transfer unit 29 and the third wafer transfer unit 22 each of which has only one arm, a first compensation value can be calculated by detecting a position deviation amount of the arm with respect to the one reference processing unit selected from the plurality of processing units accessed by the same transfer unit, as in the same manner as described above. Then, a second compensation value for the non-reference unit can be calculated based on the first compensation value and the first position information. Therefore, the position adjustment operation need not be performed for each processing unit, so that the time required for the position adjustment of the arm can be shortened.

In addition, in the above-discussed embodiment, although the position adjustment operation is performed by using the CCD camera disk 401 as a jig provided with the CCD camera 402, the jig for position recognition is not limited thereto. By way of example, an electrostatic capacitance sensor capable of measuring a distance from an object facing the sensor may be provided on a jig formed in the shape of wafer W. To be more specific, an electrostatic capacitance sensor may be provided on the jig instead of the CCD camera 402 shown in FIG. 6, for example.

Furthermore, in such as case, a recess or a protrusion to be used as a target may be formed at each processing unit's position corresponding to the wafer W held on the transfer device such as the first transfer unit A1. To elaborate, in case of forming, e.g., a recess as a target, the recess may be formed at a position where the mark 421 shown in FIG. 9 is formed.

In such a case, since the electrostatic capacitance sensor recognizes a distance from the target, a position deviation between a first transfer target position and an actual wafer transfer position in an XY-axis direction and a θ direction on the horizontal plane can be detected. Then, by using the same method in accordance with the above-described embodiment, position adjustment of the arm can be carried out.

Moreover, relative positions between a target in the reference processing unit and targets in the non-reference processing units may be stored in the ROM 202 as relative position information between the reference processing unit and the other non-reference processing units, i.e., as first position information 500. Accordingly, even in case configurations of the reference processing unit and the other non-reference processing units are different, for example, relative position information between the processing units can be still easily detected if the respective processing units are configured to have the same targets.

INDUSTRIAL APPLICABILITY

The present invention has many advantages when it is applied to control adjustment of a transfer position of a substrate transfer device that transfers a substrate such as a semiconductor wafer onto a mounting table of a processing unit.

What is claimed is:

1. A control device of a substrate processing apparatus having a plurality of processing units for performing a process on a substrate and a transfer device for holding the substrate thereon and transferring the substrate into each processing unit, the control device controlling adjustment of a transfer position of the transfer device, the control device comprising:

a storage unit that stores therein first position information indicating relative positions between one reference processing unit selected from the plurality of processing units and the rest non-reference processing units;

a first calculation unit that drives the transfer device while a jig formed in the shape of the substrate is held on the transfer device, and calculates a first compensation value for compensating a position deviation between a transfer position of the jig on the transfer device with respect to the reference processing unit and a first transfer target position; and a second calculation unit that calculates a second compensation value for compensating a position deviation between a transfer position of the jig on the transfer device with respect to the non-reference processing unit and a second transfer target position based on the first compensation value and the first position information.

2. The control device of claim 1, wherein the transfer device has a plurality of arms for holding the substrate thereon,
the storage unit stores therein second position information indicating relative positions between the respective arms,
the first calculation unit calculates the first compensation value for each arm, and
the second calculation unit calculates the second compensation value for each arm of the transfer device with respect to the non-reference processing unit based on the first compensation value of each arm, the first position information and the second position information.

3. The control device of claim 2, further comprising:
an input unit by which a first user input for selecting the reference processing unit from the plurality of processing units and a second user input for changing the selected reference processing unit are inputted.

4. The control device of claim 1, wherein the transfer device has a plurality of arms for holding the substrate thereon,
the storage unit stores therein second position information indicating relative positions between the respective arms,
the first calculation unit calculates the first compensation value for one arm selected from the plurality of arms and the first compensation value for another arm based on the first compensation value of the selected one arm and the second position information, and
the second calculation unit calculates the second compensation value for each arm of the transfer device with respect to the non-reference processing unit based on the first compensation value of the selected one arm, the first position information and the second position information.

5. The control device of claim 1, wherein a target is provided at a position within each processing unit, the position facing the substrate held on the transfer device, and
the first position information indicates relative positions between the target within the reference processing unit and the target within the non-reference processing unit.

6. A control method of a substrate processing apparatus having a plurality of processing units for performing a process on a substrate and a transfer device for holding the substrate thereon and transferring the substrate into each processing unit, the control method controlling adjustment of a transfer position of the transfer device, the control method comprising:
storing first position information indicating relative positions between one reference processing unit selected from the plurality of processing units and the rest non-reference processing units;
driving the transfer device while a jig formed in the shape of the substrate is held on the transfer device, and calculating a first compensation value for compensating a position deviation between a transfer position of the jig on the transfer device with respect to the reference processing unit and a first transfer target position; and
calculating a second compensation value for compensating a position deviation between a transfer position of the jig on the transfer device with respect to the non-reference processing unit and a second transfer target position based on the first compensation value and the first position information.

7. The control method of claim 6,
wherein a target is provided at a position within each processing unit, the position facing the substrate held on the transfer device, and
the first position information indicates relative positions between the target within the reference processing unit and the target within the non-reference processing unit.

* * * * *